United States Patent
Wodrich et al.

(10) Patent No.: US 10,551,890 B2
(45) Date of Patent: Feb. 4, 2020

(54) INTEGRATED INDUCTIVE CHARGING IN PROTECTIVE COVER

(71) Applicant: Apple Inc., Cupertino, CA (US)

(72) Inventors: Justin Richard Wodrich, Los Gatos, CA (US); Stephen Robert McClure, Belmont, CA (US)

(73) Assignee: Apple Inc., Cupertino, CA (US)

( * ) Notice: Subject to any disclaimer, the term of this patent is extended or adjusted under 35 U.S.C. 154(b) by 48 days.

(21) Appl. No.: 15/988,447

(22) Filed: May 24, 2018

(65) Prior Publication Data

US 2018/0267584 A1 Sep. 20, 2018

Related U.S. Application Data

(63) Continuation of application No. 14/532,985, filed on Nov. 4, 2014, now Pat. No. 10,007,312, which is a continuation of application No. 13/230,574, filed on Sep. 12, 2011, now Pat. No. 8,907,752.

(51) Int. Cl.
| | |
|---|---|
| *H02J 7/00* | (2006.01) |
| *G06F 1/26* | (2006.01) |
| *H02J 50/60* | (2016.01) |
| *H02J 50/10* | (2016.01) |
| *G06F 1/16* | (2006.01) |
| *H02J 17/00* | (2006.01) |
| *H05K 7/00* | (2006.01) |
| *H01F 38/14* | (2006.01) |
| *H02J 7/02* | (2016.01) |
| *H04M 1/04* | (2006.01) |

(52) U.S. Cl.
CPC .............. *G06F 1/26* (2013.01); *G06F 1/1635* (2013.01); *H01F 38/14* (2013.01); *H02J 7/0042* (2013.01); *H02J 7/025* (2013.01); *H02J 17/00* (2013.01); *H02J 50/10* (2016.02); *H02J 50/60* (2016.02); *H05K 7/00* (2013.01); *G06F 2200/1634* (2013.01); *H04M 1/04* (2013.01)

(58) Field of Classification Search
CPC .......... G06F 1/26; G06F 1/1635; H02J 50/10; H02J 50/60; H02J 7/0042; H02J 7/025; H02J 17/00; H01F 38/14; H05K 7/00
USPC .......................................... 320/108; 307/104
See application file for complete search history.

(56) References Cited

U.S. PATENT DOCUMENTS

| | | |
|---|---|---|
| 5,909,100 A | 6/1999 | Watanabe et al. |
| 7,633,263 B2 | 12/2009 | Toya |
| 7,952,322 B2 | 5/2011 | Partovi et al. |
| 8,395,353 B2 | 3/2013 | Wang et al. |
| 8,907,752 B2 | 12/2014 | Wodrich et al. |
| 2005/0057893 A1 | 3/2005 | Homer et al. |
| 2007/0236408 A1 | 10/2007 | Yamaguchi et al. |
| 2008/0278269 A1 | 11/2008 | Ramirez et al. |
| 2009/0058361 A1 | 3/2009 | John |
| 2009/0079268 A1 | 3/2009 | Cook et al. |
| 2009/0106567 A1* | 4/2009 | Baarman .............. G06F 1/1628 713/300 |
| 2009/0206791 A1* | 8/2009 | Jung ..................... H02J 50/10 320/108 |
| 2009/0212637 A1 | 8/2009 | Baarman et al. |
| 2009/0243397 A1 | 10/2009 | Cook et al. |
| 2009/0302799 A1 | 12/2009 | Marquet et al. |
| 2010/0072825 A1 | 3/2010 | Azancot et al. |

(Continued)

*Primary Examiner* — Zixuan Zhou
(74) *Attorney, Agent, or Firm* — Dickinson Wright RLLP

(57) ABSTRACT

Accurate and reliable techniques for wirelessly powering a tablet device are disclosed.

19 Claims, 12 Drawing Sheets

(56) References Cited

U.S. PATENT DOCUMENTS

| | | |
|---|---|---|
| 2010/0156344 A1 | 6/2010 | Inoue et al. |
| 2010/0201513 A1 | 8/2010 | Vorenkamp et al. |
| 2010/0259214 A1 | 10/2010 | Sip |
| 2011/0127955 A1 | 6/2011 | Chen et al. |
| 2011/0234154 A1 | 9/2011 | Navid |
| 2011/0241607 A1 | 10/2011 | Wiegers |
| 2011/0309792 A1 | 12/2011 | Mochida et al. |
| 2012/0013295 A1 | 1/2012 | Yeh |
| 2012/0032632 A1 | 2/2012 | Soar |
| 2012/0308981 A1 | 12/2012 | Libin et al. |
| 2013/0063873 A1 | 3/2013 | Wodrich et al. |
| 2013/0088192 A1 | 4/2013 | Eaton |
| 2015/0061589 A1 | 3/2015 | Wodrich et al. |

\* cited by examiner

INTEGRATED INDUCTIVE CHARGING IN PROTECTIVE COVER

CROSS-REFERENCE TO RELATED APPLICATIONS

This application is a continuation of U.S. application Ser. No. 14/532,985, filed Nov. 4, 2014, entitled "Integrated Inductive Charging in Protective Cover," now U.S. Pat. No. 10,007,312, issued Jun. 26, 2018, which is a continuation of U.S. patent application Ser. No. 13/230,574, filed Sep. 12, 2011, entitled "Integrated Inductive Charging in Protective Cover," now U.S. Pat. No. 8,907,752, issued Dec. 9, 2014, the contents of which are incorporated herein by reference in their entirety for all purposes.

FIELD

The described embodiments generally relate to portable electronic devices. More particularly, the present embodiments describe use of multiple sensors in combination to confirm a status of an accessory device in relation to an electronic device.

BACKGROUND

There continues to be dramatic growth in the use of laptops and other portable electronic devices, such as personal digital assistants, cellular phones, smart phone and portable media players. Recent advances in portable computing includes the introduction of hand held electronic devices and computing platforms along the lines of the iPad® tablet manufactured by Apple Inc. of Cupertino, Calif. These handheld computing devices can be configured such that a substantial portion of the electronic device takes the form of a display used for presenting visual content leaving little available space for an attachment mechanism that can be used for attaching an accessory device or a cord that can be used to provide power for that matter.

Although a variety of standards have been developed for providing wireless communication with electronic devices, these devices continue to be plagued with a need for corded power supplies. Typically, each electronic device requires a separate power supply cord. These cords are a burden to use, store and carrying around as needed. Cords can be unsightly and substantially hinder portable device mobility.

Therefore, a method of delivering useful power to a portable computing device, such as a tablet device, that is both efficient and does not distract from the inherent aesthetics of the tablet device is desired.

SUMMARY

This paper describes various embodiments that relate to a system, method, and apparatus for wirelessly providing power to a tablet device.

A protective cover arranged to protect at least a display of a tablet device, is disclosed. The protective cover includes at least a body portion having a size and shape in accordance with the display. In the described embodiments, the body portion includes an inductive power transmitter arranged to wirelessly pass power to a corresponding inductive power receiver unit disposed within the tablet device by inductively coupling, at least a first magnetic element, and at least a second magnetic element used to secure the body portion to the display in a closed configuration. In the closed configuration the first magnetic element is detected by a sensor disposed within the tablet device, the detection altering a current operating state of the tablet device. The protective cover also includes an attachment mechanism for pivotally attaching the body portion to the tablet device.

In another embodiment, a method for wirelessly powering a tablet device is disclosed. The method can be performed by carrying out at least the following operations: determining if a protective cover is in a closed configuration with respect to the tablet device, enabling a wireless power receiver circuit in the tablet device when it is determined that the protective cover is in the closed configuration with respect to the tablet device, and wirelessly receiving power from a wireless power transmitter associated with the protective cover.

In yet another embodiment, an apparatus for wirelessly powering a tablet device is described. The apparatus includes at least means for determining if a protective cover is in a closed configuration with respect to the tablet device, means for enabling a wireless power receiver circuit in the tablet device when it is determined that the protective cover is in the closed configuration with respect to the tablet device, and means for wirelessly receiving power from a wireless power transmitter associated with the protective cover.

Non-transitory computer readable medium executable by a processor in a tablet device for wirelessly receiving power at the tablet device is also described. The non-transitory computer readable medium includes at least computer code for determining if a protective cover is in a closed configuration with respect to the tablet device, computer code for enabling a wireless power receiver circuit in the tablet device when it is determined that the protective cover is in the closed configuration with respect to the tablet device, and computer code for wirelessly receiving power from a wireless power transmitter associated with the protective cover.

In still yet another embodiment, a segmented protective cover used to protect a display of a tablet device is disclosed. The segmented protective cover includes at least an attachment mechanism arranged to provide a repeatable, high precision attachment with a cooperating attachment feature in the tablet device, a hinge portion connected to the attachment mechanism, a body portion, the body portion pivotally connected to the hinge portion, and an inductive power transmission element incorporated into the body portion arranged to combine with an inductive power reception element in the tablet device to form an inductive power transfer circuit configured to wirelessly pass power from the protective cover and the tablet device.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION

Figure 1:
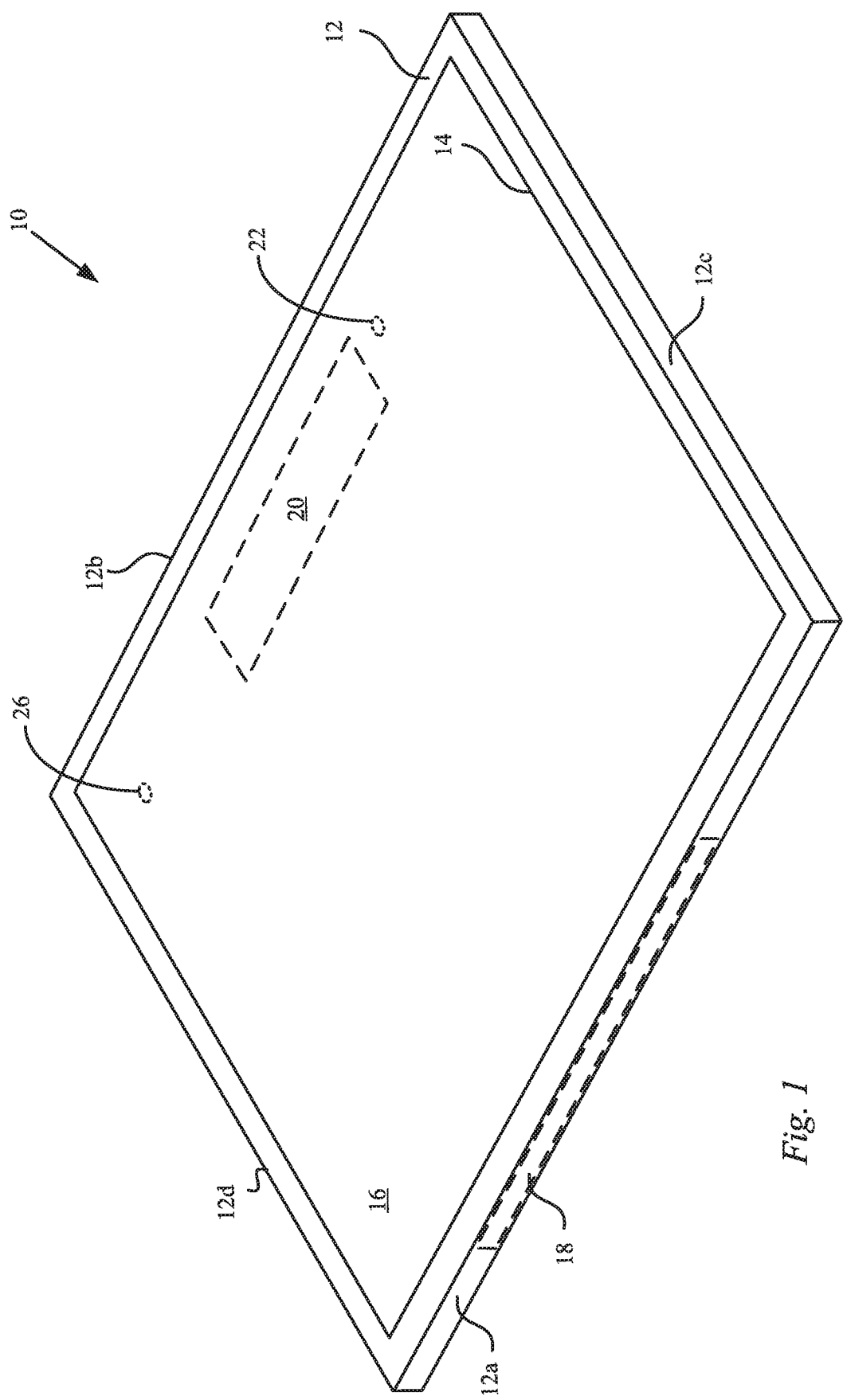
FIG. 1 shows a top perspective view of an electronic device in accordance with the described embodiments.

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following description relates in general to a mechanism that can be used to wirelessly provide power to a portable computing device. In one embodiment, the portable computing device can take the form of a tablet device such as the iPad® manufactured by Apple Inc. of Cupertino, Calif. More particularly, the tablet device can have associated with it a protective cover that can be attached and detached repeatedly and easily using magnetic attachment. The protective cover can take the form of a Smart Cover® also manufactured by Apple Inc. exclusively for use with the iPad line of tablet devices. In any case, the described embodiments relate specifically to the wireless supply of power to electronic devices using inductive coupling. More particularly, useful power can be supplied directly to a tablet device by way of a protective cover that can be placed in close proximity to a surface of the tablet device. The protective cover can include an inductive power transmitter that can take many forms such as inductive coils. The inductive coils can, in turn, receive power from an external power supply. In some cases, however, the protective cover can include an internal source of power such as a battery that can be used to store power that can subsequently be passed to the tablet device by way of the inductive power transfer circuit. In the described embodiment, the inductive power transfer circuit can be developed between the inductive power transmitter in the protective cover and an inductive power receiver in the tablet device. The power supplied through the inductive power transfer circuit can be used to power the tablet device and/or to charge the tablet device's internal batteries, if needed.

The protective cover can include an adaptive inductive power supply system capable of varying the amount of power supplied by the protective cover by way of inductive coupling based on the needs of the tablet device. The adaptive inductive power supply system can supply power to the tablet device at a proper magnitude at a beginning of an operation, as well as to continually monitor the power supply circuit and make adjustments in real-time as needed providing the adaptive power the ability to change in accordance with changes in the power requirements of the tablet device. For example, the adaptive power supply circuit can adjust characteristics, such as frequency, duty cycle and power magnitude, to accommodate various operating states (current power consumption, battery level, and so forth) of the tablet device.

More specifically, the protective cover can have a size and shape in accordance with the tablet device. In one embodiment, the protective cover can have a hinge portion and flap pivotally attached to the hinge portion. The flap can rotate about the hinge portion in one direction to bring the flap in substantial contact with the electronic device in a closed configuration. The flap can also include an inductive power transmitter unit. The inductive power transmitter unit can receive power from an external power supply by way of a detachable power cord or without the use of any power cords when power is stored internally such as in a battery incorporated into the flap. In still other embodiments, ambient power gathering devices, such as solar cells, can be used to gather ambient power (such as sunlight) to be stored internally in the flap for later inductive transfer. In the described embodiments, power can be wirelessly passed from the flap to the tablet device using an inductive power circuit formed when the inductive power transmitter in the flap inductively couples with an inductive power receiver incorporated into the tablet device.

Generally speaking, since the efficiency of the inductive power transfer is highly dependent upon the distance between the inductive power transmitter and the inductive power receiver, this distance can be minimized by placing the respective inductive power circuit components as close together as possible when the protective cover is in the closed configuration. Therefore, the inductive power transmitter can be disposed within an interior layer of the flap while the inductive power receiver can be placed in a corresponding location beneath the display of the tablet device or any other appropriate location. In some embodiments, the inductive circuit elements can be located in a peripheral region of the flap and corresponding peripheral regions of the tablet device (such as beneath the display mask that borders an active portion of the display). In this way, power can be inductively transmitted between the flap and tablet device in any number of ways and using any number of configurations of inductive power transfer circuits. Therefore, one of the advantages to using magnetic attachment is the ability to repeatedly magnetically attach the protective cover and the tablet device in a precise location and orientation. In this way, the ability to easily and without much ado on the part of the end user to align the various components of the inductive power transfer circuit is greatly enhanced.

It should be noted, however, that in those cases where the protective cover is magnetically attached to the tablet device, that the relative positioning of the inductive power circuits and the magnetic elements used to support the magnetic attachment must be taken into consideration due to the potential for magnetic interference and subsequent degrading of the power transfer efficiency. Accordingly, the use of various placements, sizes and shapes of the inductive power circuit components (i.e., inductive power transmitter and receivers) can be widely varied in order to accommodate any magnetic attachment features, or any other magnetically sensitive circuit (such as a compass or Hall Effect sensor) present in the tablet device or the protective cover.

In one embodiment, the electronic device can have a display that overlays an inductive receiving circuit arranged to inductively receive power from the protective cover via the inductive power transmitter included therein. In order to assure that none of the components of the inductive power transfer circuit is visible, the components can be placed beneath a display device. In those cases, however, where the display includes a display masking region used to hide various display components, the components of the inductive power transfer circuit can be located beneath the display mask. Of course, the corresponding inductive power transfer circuits incorporated into the protective cover must be similarly located in peripheral regions of the flap.

It should also be noted that magnetic materials included in the protective cover can affect the performance of the inductive power transfer circuit. The magnetic materials in the protective cover can include that use to activate a Hall Effect sensor or used to magnetically form a support structure by appropriate folding of one embodiment of the protective cover. Accordingly, inductive power transfer components are generally placed away from such magnetic materials in order to avoid any unnecessary reduction in inductive power transfer efficiency.

These and other embodiments are discussed below with reference to FIGS. 1-11. However, those skilled in the art will readily appreciate that the detailed description given herein with respect to these figures is for explanatory purposes only and should not be construed as limiting. For the remainder of this discussion for simplicity and clarity, inductive power transfer between a protective cover and an associated electronic device is described. It should be noted, however, that any number and type of suitably configured objects that can be magnetically attached to each other in a precise and repeatable manner can be used.

The electronic device can take many forms. For the remainder of this discussion, the electronic device is described in terms of a handheld portable computing device. Accordingly, FIG. 1 shows a top perspective view of electronic device 10 in accordance with the described embodiments. Electronic device 10 can process data and more particularly media data such as audio, visual, images, etc. Electronic device 10 can be hand held. With regards to being handheld, electronic device 10 can be held in one hand while being operated by the other hand (i.e., no reference surface such as a desktop is needed). Hence, electronic device 10 can be held in one hand while operational input commands can be provided by the other hand. The operational input commands can include operating a volume switch, a hold switch, or by providing inputs to a touch sensitive surface such as a touch sensitive display device or a touch pad.

Electronic device 10 can include housing 12. In some embodiments, housing 12 can take the form of a single piece housing formed of any number of materials such as plastic or non-magnetic metal which can be forged, molded, or otherwise formed into a desired shape. In those cases where electronic device 10 has a metal housing and incorporates radio frequency (RF) based functionality, a portion of housing 12 can include radio transparent materials such as ceramic, or plastic. Housing 12 can be configured to enclose a number of internal components. For example, housing 12 can enclose and support various structural and electrical components (including integrated circuit chips) to provide computing operations for electronic device 10. The integrated circuits can take the form of chips, chip sets, or modules any of which can be surface mounted to a printed circuit board, or PCB, or other support structure. For example, a main logic board (MLB) can have integrated circuits mounted thereon that can include at least a microprocessor, semi-conductor memory (such as FLASH), and various support circuits and so on. Housing 12 can include opening 11 for placing internal components and as necessary can be sized to accommodate display assembly for presenting visual content, the display assembly being covered and protected by cover layer 16. In some cases, the display assembly can be touch sensitive allowing tactile inputs that can be used to provide control signals to electronic device 10. In some cases, the display assembly may be a large prominent display area that covers a majority of the real estate on the front of the electronic device.

Electronic device 10 can include a magnetic attachment system that can be used to magnetically attach electronic device 10 to at least one other suitably configured object. The magnetic attachment system can include a number of magnetic attachment features distributed within and in some cases connected to housing 12. For example, the magnetic attachment system can include first magnetic attachment feature 18 and second magnetic attachment feature 20 located on different sides of electronic device 10. In particular, first magnetic attachment feature 18 can be located in proximity to side wall 12a of housing 12. Second magnetic attachment feature 20 can be located within opening 11 near side wall 12b of housing 12. In those embodiments where electronic device 10 includes a display with cover glass substantially filling opening 11, second attachment feature 20 can be placed beneath the display. In some embodiments, tablet device 10 can include various sensors 22 that can be used to detect external stimuli and respond by providing a signal that can be used by tablet device 10 to alter a current operating state. For example, when sensor 22 takes the form of a Hall Effect sensor, the external stimulus can take the form of a saturating magnetic field provided by an extrinsic magnetic element.

Figure 2A:
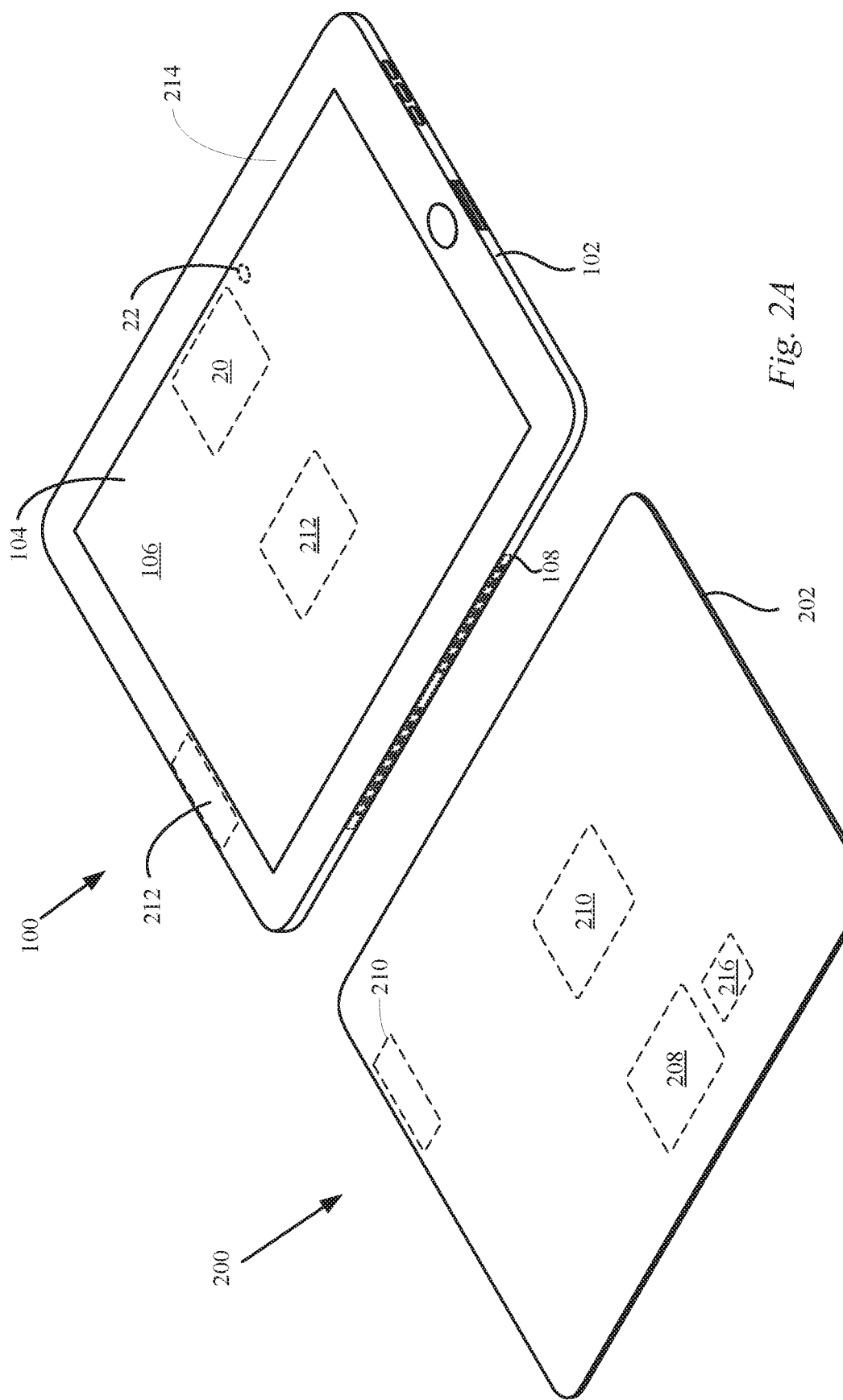
FIG. 2A shows a first perspective view of the electronic device in the form of a tablet device and the accessory device in the form of a protective cover.
Figure 2B:
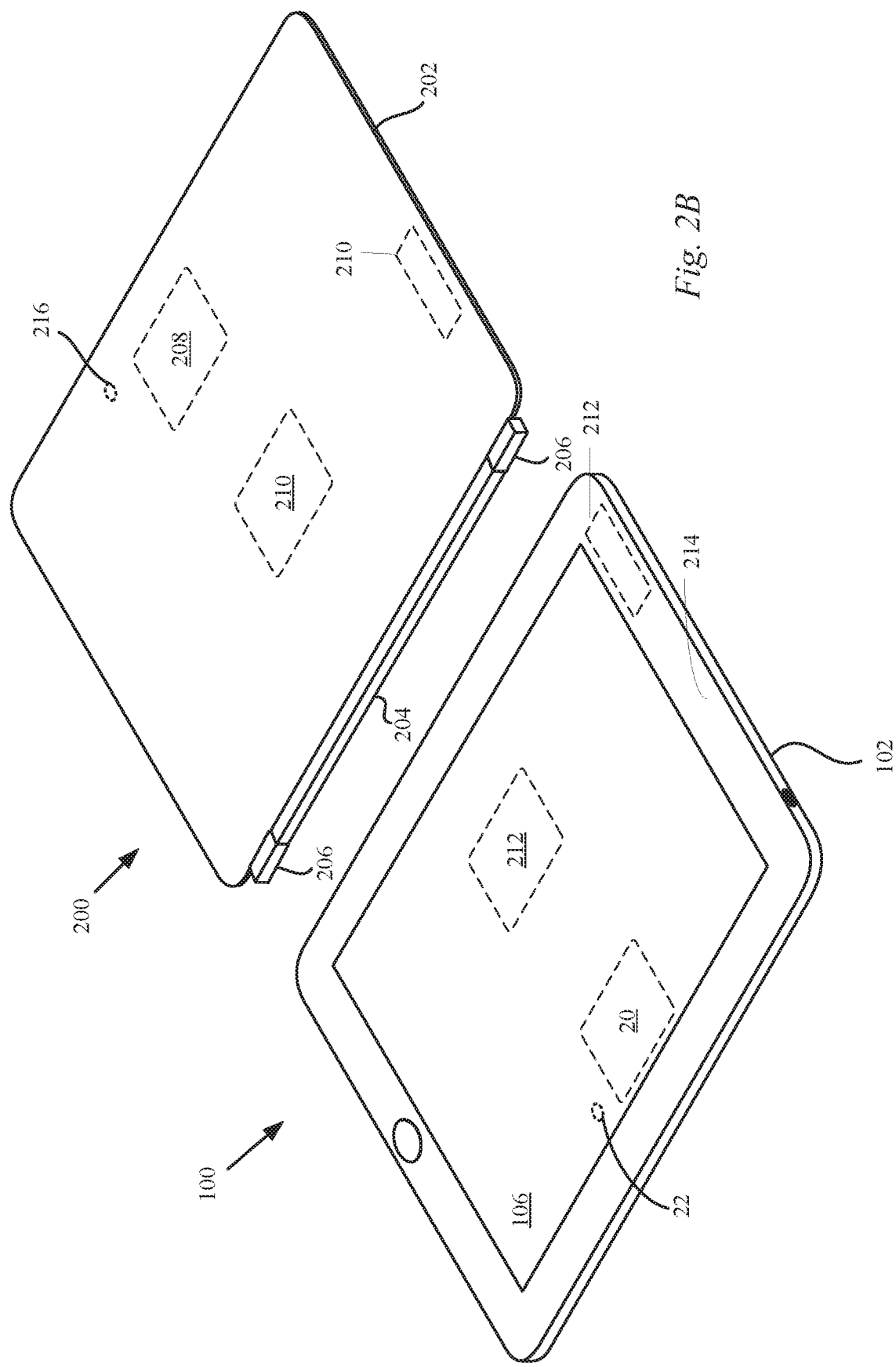
FIG. 2B shows a second perspective view of the electronic device in the form of a tablet device and the accessory device in the form of a protective cover.

FIG. 2A and FIG. 2B show electronic device 100 presented in terms of tablet device 100 and accessory device 200 is shown as protective cover 200 each in perspective top views. These elements may generally correspond to any of those previously mentioned. In particular, FIGS. 2A and 2B shows two perspective views of tablet device 100 and protective cover 200 in the open configuration. For example, FIG. 2A shows device attachment feature 108 included in tablet device 100 and its relationship to tablet device 100. FIG. 2B, on the other hand, is the view presented in FIG. 2A rotated about 180° to provide a second view of attachment feature 202 and its relationship with protective cover 200.

Tablet device 100 can take the form of a tablet computing device such as the iPad® manufactured by Apple Inc. of Cupertino, Calif. Referring now to FIG. 2A, tablet device 100 can include housing 102 that can enclose and support device attachment feature 108. In order to not interfere with the magnetic field generated by device attachment feature 108, at least that portion of housing 102 nearest device attachment feature 108 can be formed of any number of non-magnetic materials such as plastic or non-magnetic metal such as aluminum. Housing 102 can also enclose and support internally various structural and electrical components (including integrated circuit chips and other circuitry) to provide computing operations for tablet device 100. Housing 102 can include opening 104 for placing internal components and can be sized to accommodate a display assembly or system suitable for providing a user with at least visual content as for example via a display. In some cases, the display assembly can include touch sensitive capabilities providing the user with the ability to provide tactile inputs to tablet device 100 using touch inputs. The display assembly can be formed of a number of layers including a topmost layer taking the form of transparent cover glass 106 formed of polycarbonate or other appropriate plastic or highly polished glass. Using highly polished glass, cover glass 106 can substantially fill opening 104.

Although not shown, the display assembly underlying cover glass 106 can be used to display images using any suitable display technology, such as LCD, LED, OLED, electronic or e-inks, and so on. The display assembly can be placed and secured within the cavity using a variety of mechanisms. In one embodiment, the display assembly is snapped into the cavity. It can be placed flush with the adjacent portion of the housing. In this way, the display can present visual content that can include visual, still images, as well as icons such as graphical user interface (GUI) that can provide information the user (e.g., text, objects, graphics) as well as receive user provided inputs. In some cases, displayed icons can be moved by a user to a more convenient location on the display. In some embodiments, a display mask can be applied to, or incorporated within or under cover glass 106. The display mask can be used to accent an unmasked portion of the display used to present visual content and can be used to make less obvious device attachment feature 108 and securing attachment feature 20.

Figure 3A:
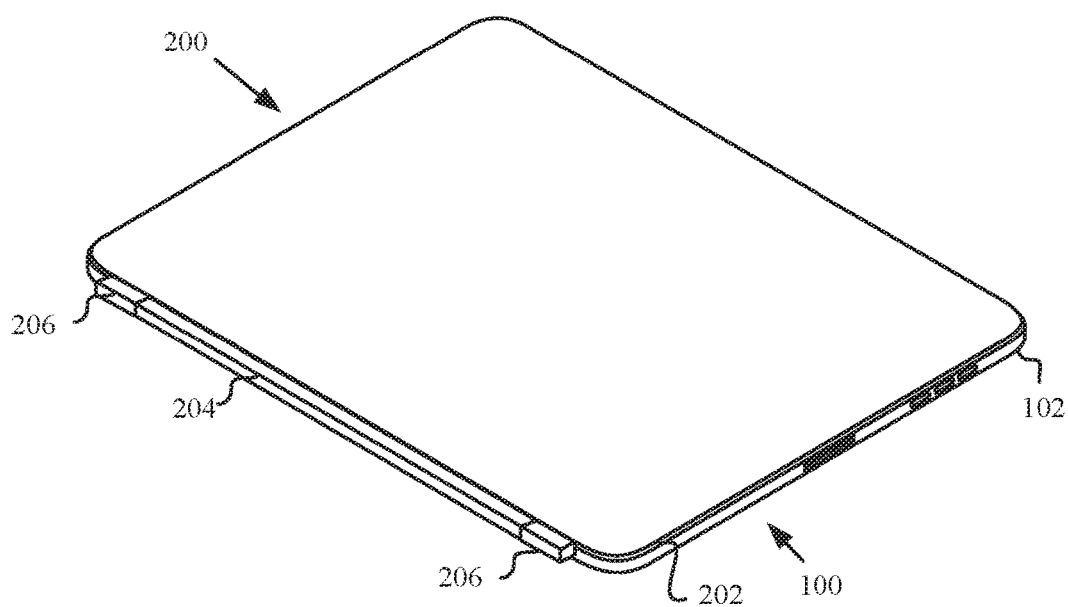
FIG. 3A shows a closed configuration of the cooperating system formed by the tablet device and protective cover shown in FIGS. 2A and 2B.

Protective cover 200 can have a look and feel that complements that of the tablet device 100 adding to overall look and feel of tablet device 100. Protective cover 200 is shown in FIGS. 2A and 2B attached to tablet device 100 in an open configuration in which cover glass 106 is fully viewable. Protective cover 200 can include flap 202. In one embodiment, flap 202 can have a size and shape in accordance with cover glass 106. Flap 202 can be pivotally connected to accessory attachment feature 204 by way of hinge assembly 206 each shown in FIG. 2B. The magnetic attachment force between attachment feature 204 and device attachment feature 108 can maintain protective cover 200 and tablet device 100 in a proper orientation and placement vis-a-vis flap 202 and cover glass 106. By proper orientation it is meant that protective cover 200 can only properly attach to tablet device 100 having flap 202 and cover glass 106 aligned in a mating engagement. The mating arrangement between cover glass 106 and flap 202 is such that flap 202 covers substantially all of cover glass 106 when flap 202 is placed in contact with cover glass 106 as shown in FIG. 3A. In one embodiment, flap 202 can be magnetically secured to cover glass 106 in the closed configuration by way of magnetic attachment between magnetic element 208 and securing attachment feature 20. In some embodiments, magnetic element 208 can also be detected by sensor 22 providing an indication that protective cover 200 is in the closed configuration with respect to tablet device 100.

Flap 202 can be pivotally connected to hinge assembly 206 that, in turn, can be connected to attachment feature 204. Hinge assembly 206 can, in turn, be coupled to electronic device 100 by way of accessory attachment feature 204. In this way, the flap 202 can be used as a protective cover to protect aspects of electronic device 100 such as a display cover 106. Flap 202 can be formed of various materials such as plastic, cloth, and so forth. Flap 202 can be segmented in such a way that a segment of the flap can be lifted to expose a corresponding portion of the display. Flap 202 can also include a functional element that can cooperate with a corresponding functional element in electronic device 100. In this way, manipulating flap 202 can result in an alteration in the operation of electronic device 100.

Useful power can be wirelessly transferred from protective cover 200 to tablet device 100 by way of a wireless power transfer circuit. In one embodiment, the wireless power transfer circuit can include a wireless power transmitter unit wirelessly coupled to a wireless power receiver unit. In the embodiment shown, the wireless power transfer circuit can rely upon inductive coupling to provide the requisite wireless power transfer channel between flap 202 and tablet device 100. In particular, flap 202 can include inductive power transmitter 210 and tablet device 100 can include inductive power receiver 212 each aligned with each other in the mating configuration mediated by accessory attachment feature 204. In this way, the precise alignment required for efficient inductive power transfer can be automatically achieved merely by magnetically attaching protective cover 200 and tablet device 100 using the requisite magnetic attachment mechanism described herein. It should also be noted that the various components of the inductive power transfer circuit can be placed in almost any location in flap 202 and tablet device 100. For example, display mask 211 can be used to obscure portions of inductive power receiver 212 that correspond with elements of inductive power transmitter 210 placed in peripheral regions of flap 202.

Figure 3B:
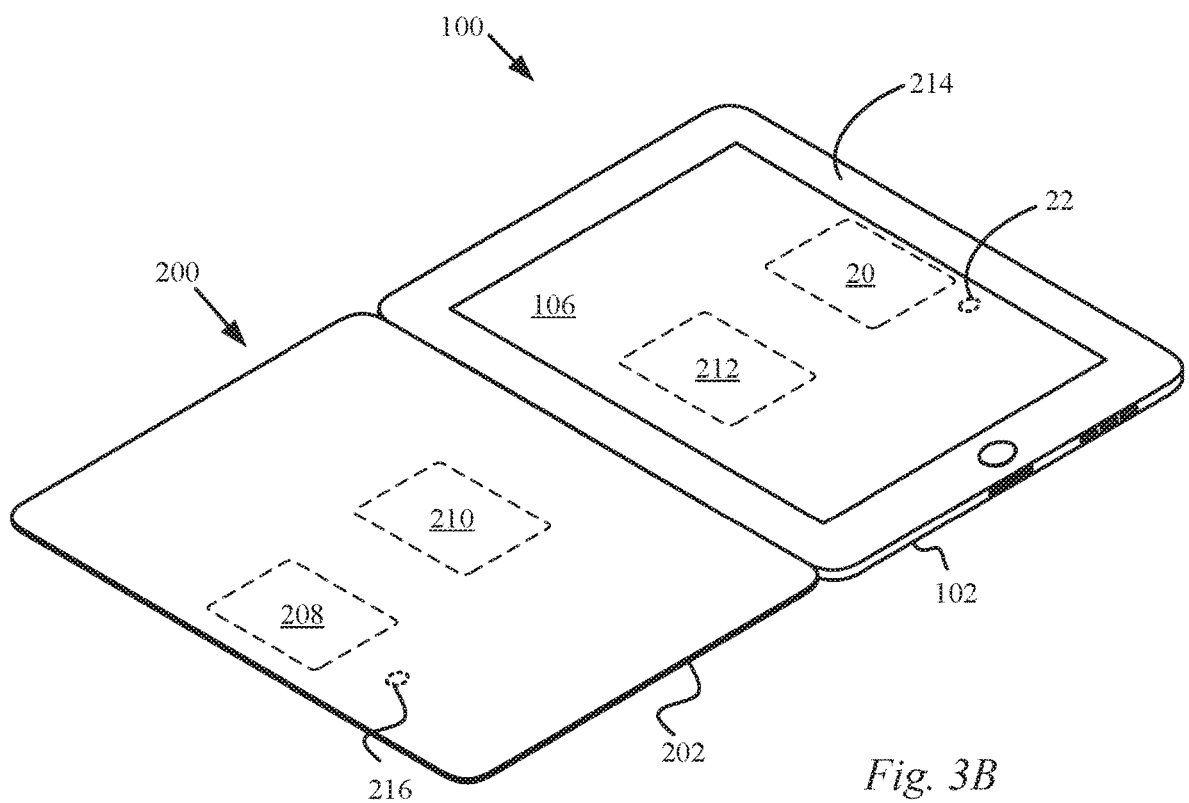
FIG. 3B shows an open configuration of the cooperating system shown in FIG. 3A.

FIGS. 3A and 3B show protective cover 200 and tablet device 100 magnetically attached to each other. FIG. 3A shows a closed configuration in which cover glass 106 is fully covered by and in contact with flap 202. Protective cover 200 can pivot about hinge assembly 206 from the closed configuration of FIG. 3A to an open configuration of FIG. 3B. In the closed configuration, inner layer of flap 202 can come in direct contact with cover glass 106. In this way, inductive power transmitter 210 and inductive power receiver 212 can be aligned with each other in such a way that useful power can be transferred between flap 202 and tablet device 100. In one embodiment, a sensor in tablet device 100 can detect magnetic element 216 in flap 202 and in so doing can provide an indication to tablet device 100 that flap 202 is in a closed configuration with respect to tablet device 100. The indication can be used by tablet device 100 to determine a tablet device power status and based upon that determination, enable an inductive power transfer between flap 202 and tablet device 100. For example, the determination of the tablet device power status can indicate that tablet device 100 is in a portable mode (i.e., no power provided from an external power supply via a power cable). In the portable mode, tablet device 100 receives all power from an internal power supply, such as a battery. In this case, therefore, tablet device 100 would ascertain a current charge state of the battery, and based upon the current charge state, enable (or not) the inductive power transfer circuit. In this way, power can be wirelessly passed from inductive power transmitter 210 to inductive power receiver 212 that can, in turn, be used to power tablet device 100 directly, provide power to the battery. It should be noted that in the case where tablet device 100 is not active and the battery is fully charged, disable the power transfer circuit until needed.

Figure 4:
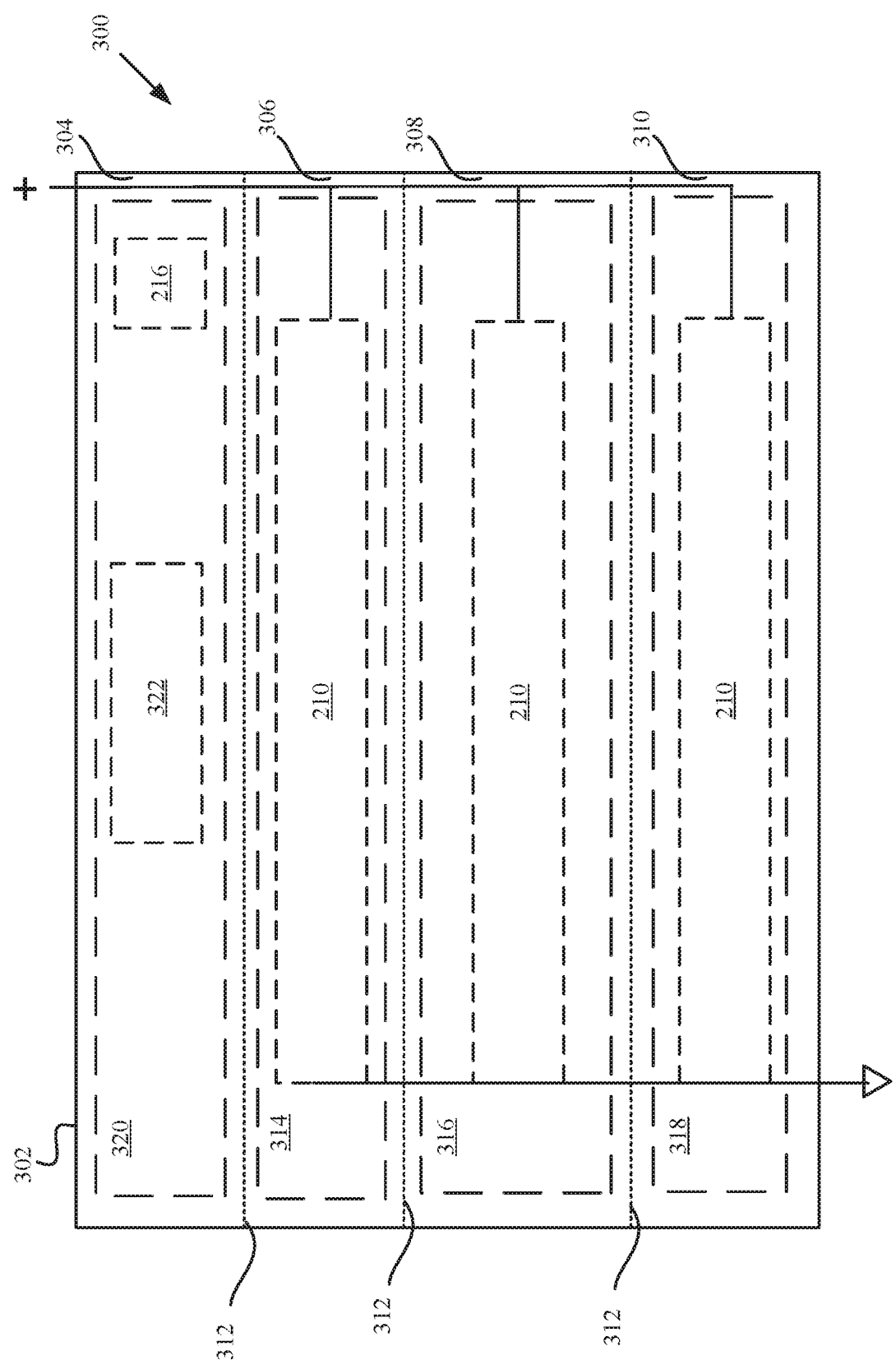
FIG. 4 shows a top view of an embodiment of a segmented cover assembly.

FIG. 4 shows a top view of a specific embodiment of protective cover 200 in the form of segmented cover 300.

Segmented cover 300 can include body 302. Body 302 can have a size and shape in accordance with tablet device 100. Body 302 can be formed from a single piece of foldable or pliable material. Body 302 can also be divided into segments separated from each other by a folding region. In this way, the segments can be folded with respect to each other at the folding regions. In one embodiment, body 302 can be formed layers of material attached to one another forming a laminate structure. Each layer can take the form of a single piece of material that can have a size and shape in conformance with body 302. Each layer can also have a size and shape that correspond to only a portion of body 302. For example, a layer of rigid or semi-rigid material about the same size and shape of a segment can be attached to or otherwise associated with the segment.

In a specific embodiment, segmented body 302 can be partitioned into a number of segments 304-310 interspersed with thinner, foldable portions 312. Each of the segments 304-310 can include one or more inserts disposed therein. By way of example, the segments can include a pocket region where the inserts are placed or alternatively the inserts may be embedded within the segments (e.g., insert molding). If pockets used, the pocket region can have a size and shape to accommodate corresponding inserts. The inserts can have various shapes but are most typically shaped to conform to the overall look of segmented body 302 (e.g., rectangular). The inserts can be used to provide structural support for segmented body 302. That is, the inserts can provide stiffness to the cover assembly. In some cases, the inserts may be referred to as stiffeners. As such, the cover assembly is relatively stiff except along the foldable regions that are thinner and do not include the inserts (e.g., allows folding) making segmented cover 300 more robust and easier to handle. In one embodiment segments 304, 306, and 310 can be related to segment 308 in size in the proportion of about 0.72 to 1 meaning that segments 304, 306 and 310 are sized in width to be about 72% of the width of segment 308. In this way, a triangle having appropriate angles can be formed (i.e., about 75° for display stand and about 11° for keyboard stand discussed below).

Segments 306, 308, and 310 can include inserts 311, 316, and 318, respectively (shown in dotted lines form). Inserts 311-318 can be formed of rigid or semi-rigid non-conductive or magnetic material adding resiliency to body 302. Examples of materials that can be used include plastics, fiber glass, carbon fiber composites, and the like. Segment 304 can include insert 320 also formed of resilient material such as plastic but also arranged to accommodate magnetic elements 322 some of which can interact with magnetic elements in table device 100 and more specifically attachment feature 20. Inserts 311-318 can also incorporate inductive power transmitter 210 each of which can be connected to an external power supply (not shown) by way of line 320 that can be connected to housing 12 of tablet device 100 when segmented cover 300 is attached to tablet device 100. It should be noted that in some instances it may be preferable for inductive power transmitter 208 to be formed as a single continuous loop circuit shown in FIG. 4B.

Due to the ability of segmented body 302 to fold and more particularly the various segments to fold with respect to each other, most of magnetic elements 322 can be used to magnetically interact with a magnetically active insert (not shown) embedded in insert 318. By magnetically binding both active insert 324 and magnetic elements 322 various support structures can be formed some of which can be triangular in shape. The triangular support structures can aid in the use of tablet device 100. For example, one triangular support structure can be used to support tablet device 100 in such a way that visual content can be presented at a desirable viewing angle of about 75° from horizontal. However, in order be able to appropriately fold segmented cover 300, segment 308 can be sized to be somewhat larger than segments 304, 306 and 310 (which are generally the same size). In this way, the segments can form a triangle having two equal sides and a longer third side, the triangle having an interior angle of about 75°.

Figure 5:
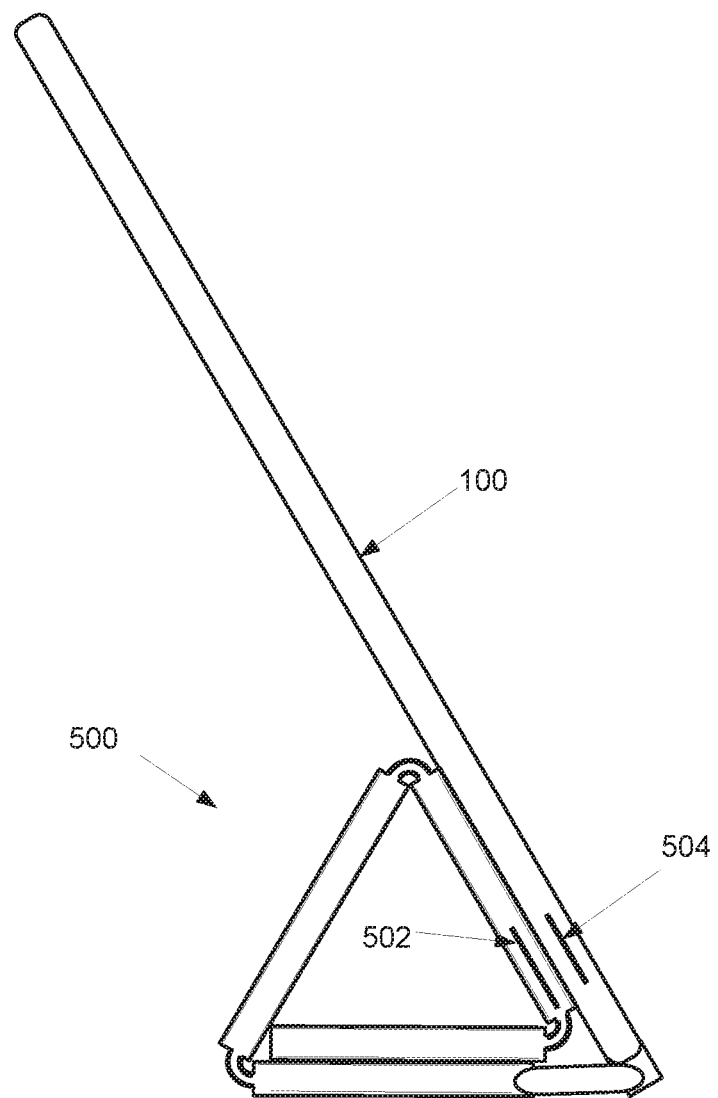
FIG. 5 show another folded implementation of segmented cover in which triangular support structure can be used to support a tablet device in a viewing state.
Figure 6:
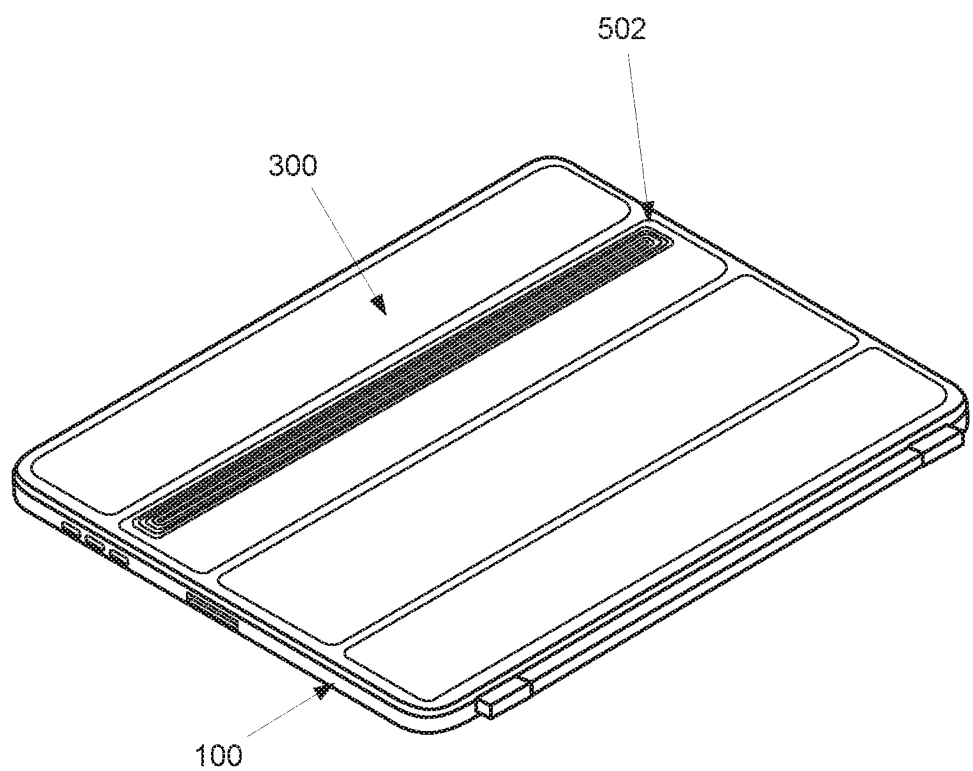
FIG. 6 shows a top view of segmented cover in a closed configuration with respect to a tablet device showing more clearly inductive power transmitter.
Figure 7:
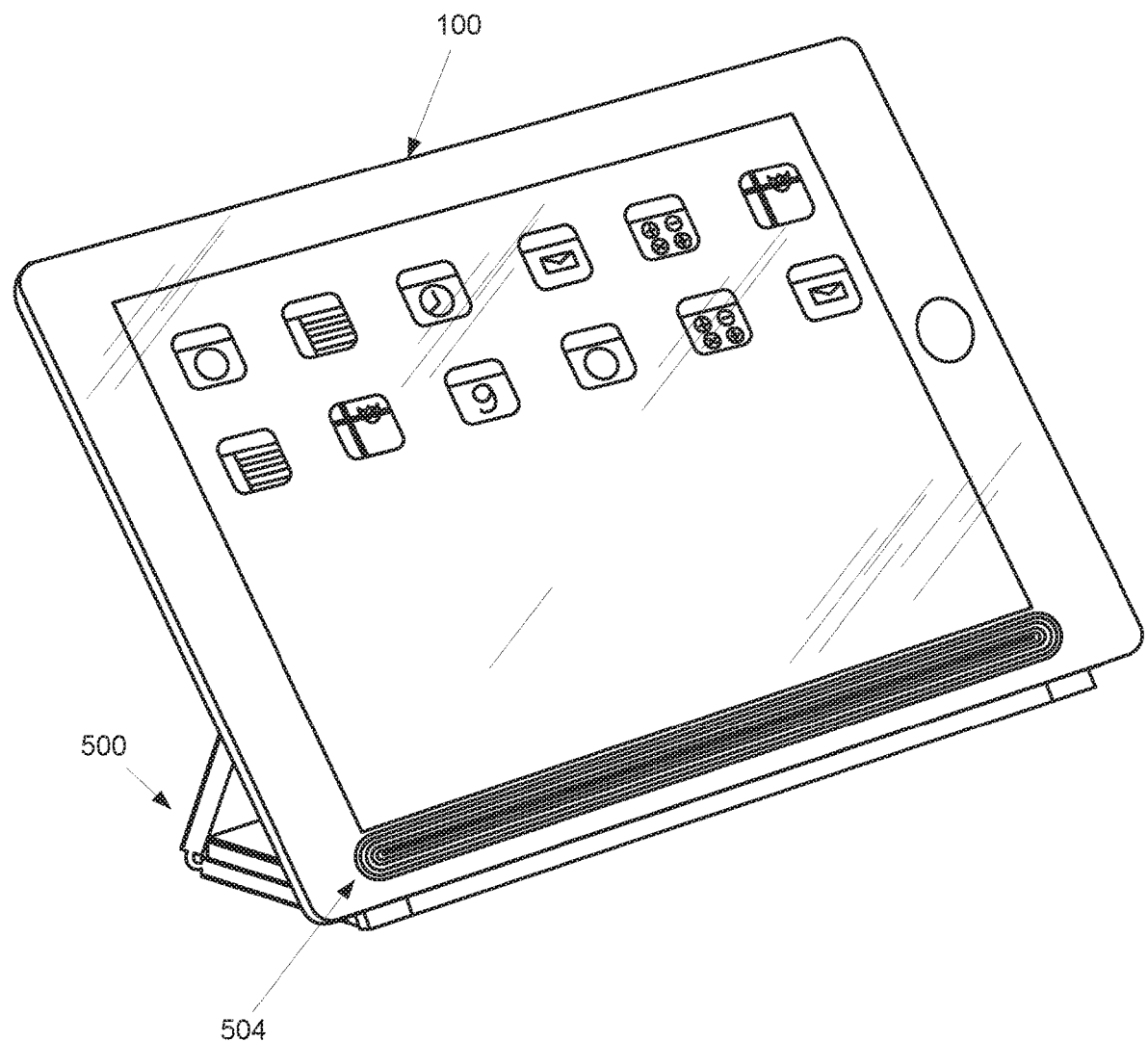
FIG. 7 shows a front perspective view of a tablet device supported by triangular support structure.

FIG. 5 show another folded implementation of segmented cover 300 in which triangular support structure 500 can be used to support tablet device 100 in a viewing state. By viewing state it is meant that visual content (visual, stills, animation, etc.) can be presented at a viewer friendly angle of about 75° from horizontal by tablet device 100. In this "kickstand" state, visual content can be presented for easy viewing. A viewable area of tablet device 100 can be presented at an angle of about 75° which has been found to be within a range of viewing angles considered optimal for a good viewing experience. In this arrangement, inductive power transmitter 502 can be used to wirelessly transfer power to tablet device 100 by way of inductive power receiver 504. FIG. 6 shows a top view of segmented cover 300 in a closed configuration with respect to tablet device 100 showing more clearly inductive power transmitter 502. It should be noted that the embodiment of inductive power transmitter 502 shown is for illustrative purposes only. FIG. 7 shows a front perspective view of tablet 100 supported by triangular support structure 500. In this way, tablet device 100 can present visual content at a user friendly manner.

Figure 8:
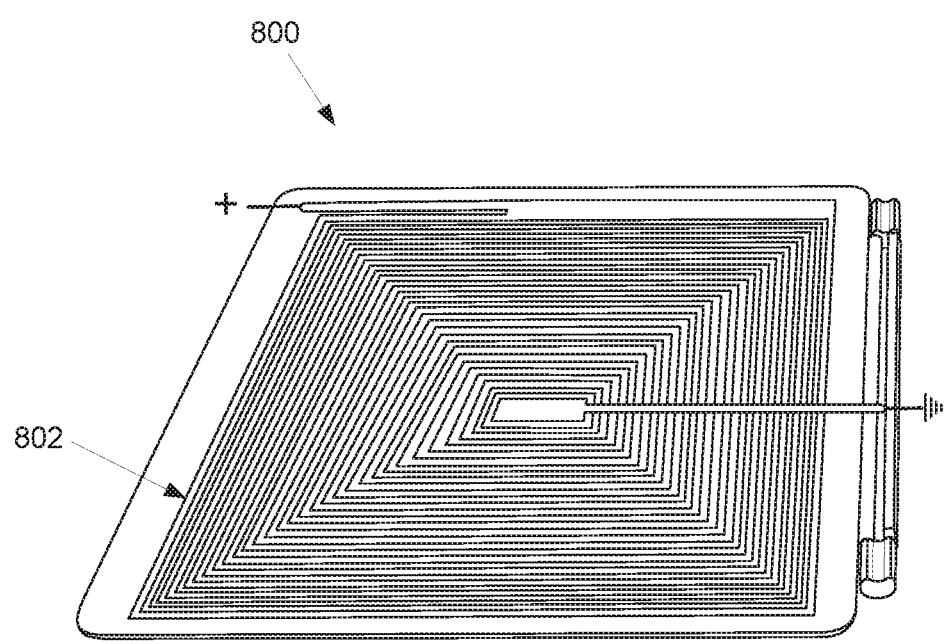
FIG. 8 shows another embodiment of protective flap that includes single continuous element type inductive power transmitter.

FIG. 8 shows another embodiment 800 of protective flap 200 that includes single continuous element type inductive power transmitter 802. Using a single continuous conductive element provides for a maximum amount of power being wirelessly transferred from inductive power transmitter 802 to a correspondingly sized and shaped inductive power receiver. Although shown protective cover 200 in this embodiment as particular embodiment is not segmented, it should be noted that inductive power transmitter 810 can be used in segmented cover 300 as long as the conductive material used to form inductive power transmitter 810 has sufficient flexibility to maintain conductive integrity throughout the anticipated useful life of segmented cover 300.

Figure 9:
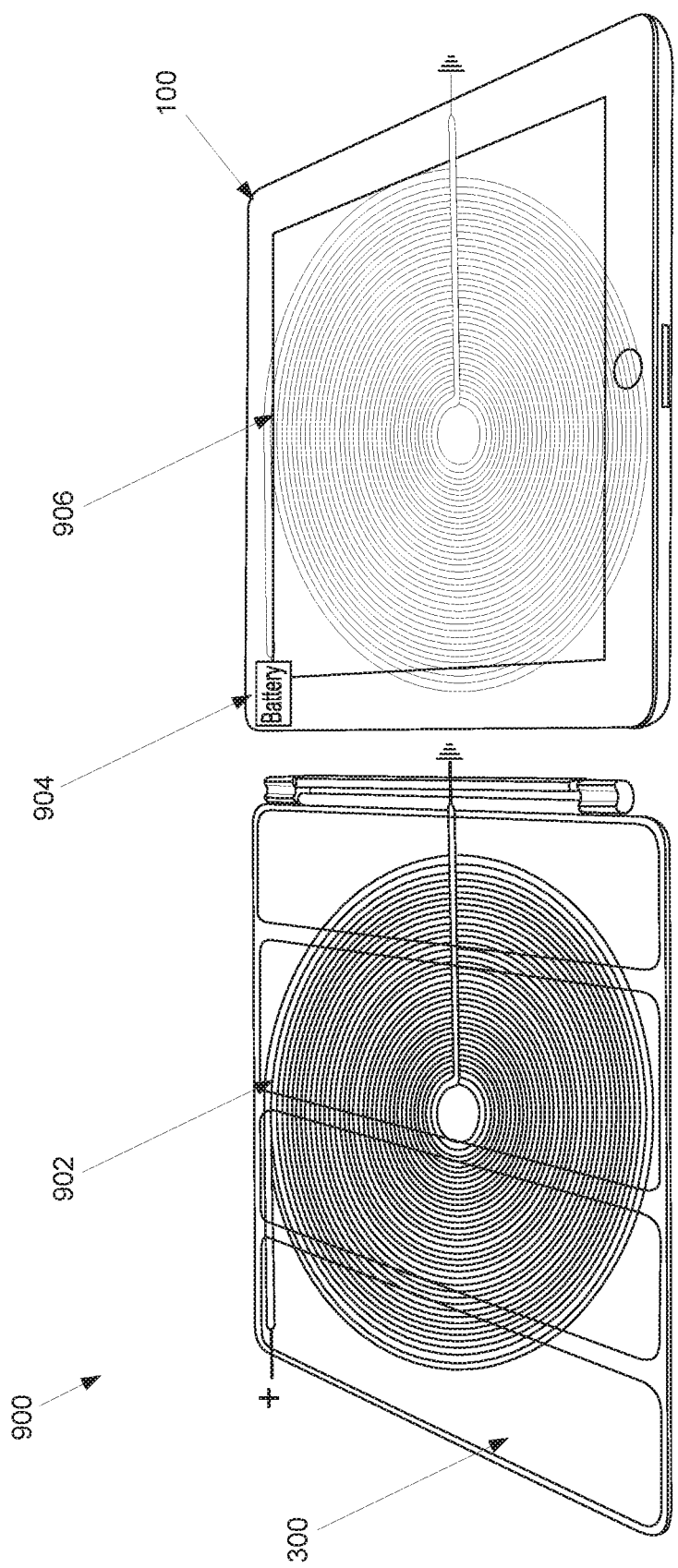
FIG. 9 shows another embodiment of single continuous element type inductive power transmitter in the form of circular inductive power transmitter.

FIG. 9 shows another embodiment 900 of single continuous element type inductive power transmitter 802 in the form of circular inductive power transmitter 902. It should be noted that battery unit 904 can be connected to corresponding inductive power receiver 906. In this way, battery unit 904 can be recharged as needed by power wirelessly received from inductive power transmitter 902.

Figure 10:
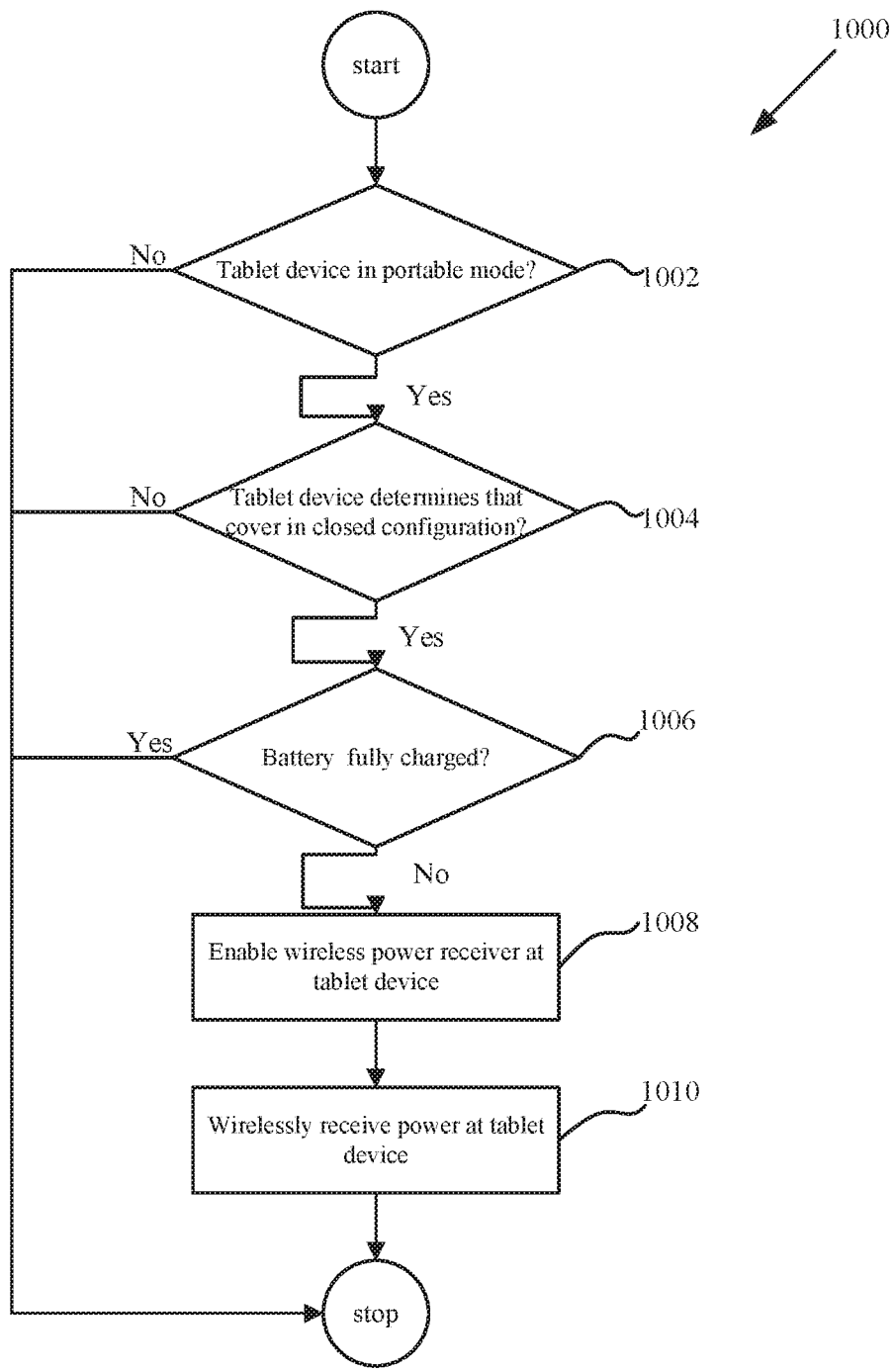
FIG. 10 shows a flowchart detailing process for wirelessly receiving power at a tablet device in accordance with the described embodiments.

FIG. 10 shows a flowchart detailing process 1000 for wirelessly receiving power at a tablet device in accordance with the described embodiments. Process 1000 can be carried out by determining if the tablet device is in a portable mode at 1002. By portable mode it is meant that the tablet device is not connected to an external power supply and therefore receives all operational power from an internal power source, such as a battery. If it is determined that the tablet device is not in the portable mode and therefore is receiving power from the external power supply by way of, for example, a power cord, process 1000 ends since there is no need for the tablet device to wirelessly receive power. On the other hand, if it is determined that the tablet device is in the portable mode, then at 1004 a determination is made by the tablet device is a protective cover is in a closed configuration with respect to the tablet device. This determination can be accomplished in many ways. For example, if the protective cover has an appropriately situated magnetic element that can be detected by a magnetically sensitive sensor (such as a Hall Effect sensor) in the tablet device, then the presence of a magnetic field associated with the magnetic element can indicate that the protective cover is in the closed configuration with respect to the tablet device. Other sensors that can be used to determine the positional status of the protective cover with regards to the tablet device can include an ambient light sensor (ALS), an image capture device (such as a camera) and so on. In any case, if it is determined that the protective cover is not in the close configuration with respect to the tablet device, then process 1000 ends. On the other hand, if it is determined that the protective cover is in the closed configuration with respect to the tablet device, then at 1006 a determination is made if the battery in the tablet device is fully charged. If it is determined that the battery is fully charged, then process 1000 ends as it would preclude the possibility of overcharging the battery.

It should be noted, however, that in those cases where tablet device includes circuitry that prevents battery overcharging, then process 1000 can nonetheless continue. However, for sake of simplicity it is presumed that the table device has no such circuitry and when it is determined that the battery is not fully charged, and then at 1008, the tablet device enables a wireless power receiver. In one embodiment, the wireless power receiver can be an inductive power receiver arranged to receive useful power inductively from a corresponding inductive power transmitter located in the protective cover. Once the wireless power receiver is enabled, useful power can be wirelessly received at the tablet device at 1008.

Figure 11:
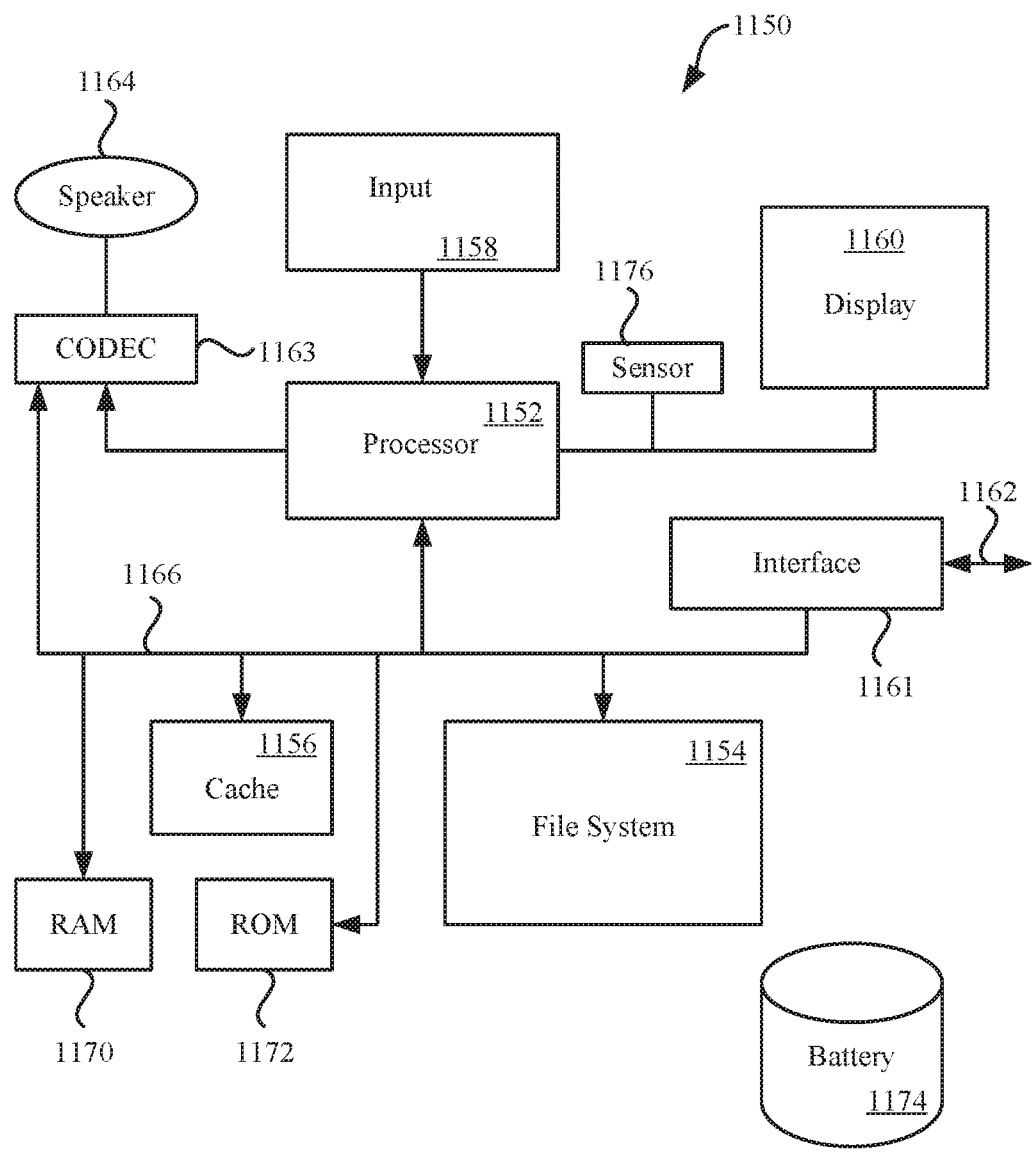
FIG. 11 is a block diagram of an electronic device suitable for use with the described embodiments.

FIG. 11 is a block diagram of an electronic device 1150 suitable for use with the described embodiments. The electronic device 1150 illustrates circuitry of a representative computing device. The electronic device 1150 includes a processor 1152 that pertains to a microprocessor or controller for controlling the overall operation of the electronic device 1150. The electronic device 1150 stores media data pertaining to media items in a file system 1154 and a cache 1156. The file system 1154 is, typically, a storage disk or a plurality of disks. The file system 1154 typically provides high capacity storage capability for the electronic device 1150. However, since the access time to the file system 1154 is relatively slow, the electronic device 1150 can also include a cache 1156. The cache 1156 is, for example, Random-Access Memory (RAM) provided by semiconductor memory. The relative access time to the cache 1156 is substantially shorter than for the file system 1154. However, the cache 1156 does not have the large storage capacity of the file system 1154. Further, the file system 1154, when active, consumes more power than does the cache 1156. The power consumption is often a concern when the electronic device 1150 is a portable media device that is powered by a battery 1174. The electronic device 1150 can also include a RAM 1170 and a Read-Only Memory (ROM) 1172. The ROM 1172 can store programs, utilities or processes to be executed in a non-volatile manner. The RAM 1170 provides volatile data storage, such as for the cache 1156.

The electronic device 1150 also includes a user input device 1158 that allows a user of the electronic device 1150 to interact with the electronic device 1150. For example, the user input device 1158 can take a variety of forms, such as a button, keypad, dial, touch screen, audio input interface, visual/image capture input interface, input in the form of sensor data, etc. Still further, the electronic device 1150 includes a display 1160 (screen display) that can be controlled by the processor 1152 to display information to the user. A data bus 1166 can facilitate data transfer between at least the file system 1154, the cache 1156, the processor 1152, and the CODEC 1163.

In one embodiment, the electronic device 1150 serves to store a plurality of media items (e.g., songs, podcasts, etc.) in the file system 1154. When a user desires to have the electronic device play a particular media item, a list of available media items is displayed on the display 1160. Then, using the user input device 1158, a user can select one of the available media items. The processor 1152, upon receiving a selection of a particular media item, supplies the media data (e.g., audio file) for the particular media item to a coder/decoder (CODEC) 1163. The CODEC 1163 then produces analog output signals for a speaker 1164. The speaker 1164 can be a speaker internal to the electronic device 1150 or external to the electronic device 1150. For example, headphones or earphones that connect to the electronic device 1150 would be considered an external speaker.

The electronic device 1150 also includes a network/bus interface 1161 that couples to a data link 1162. The data link 1162 allows the electronic device 1150 to couple to a host computer or to accessory devices. The data link 1162 can be provided over a wired connection or a wireless connection. In the case of a wireless connection, the network/bus interface 1161 can include a wireless transceiver. The media items (media assets) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 1176 can take the form of circuitry for detecting any number of stimuli. For example, sensor 1176 can include a Hall Effect sensor responsive to external magnetic field, an audio sensor, a light sensor such as a photometer, and so on.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The computer readable medium is defined as any data storage device that can store data which can thereafter be read by a computer system. Examples of the computer readable medium include read-only memory, random-access memory, CD-ROMs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. It will be apparent to one of ordinary skill in the art that many modifications and variations are possible in view of the above teachings.

The advantages of the embodiments described are numerous. Different aspects, embodiments or implementations can yield one or more of the following advantages. Many features and advantages of the present embodiments are apparent from the written description and, thus, it is intended by the appended claims to cover all such features and advantages of the invention. Further, since numerous modifications and changes will readily occur to those skilled in the art, the embodiments should not be limited to the exact construction and operation as illustrated and described. Hence, all suitable modifications and equivalents can be resorted to as falling within the scope of the invention.

What is claimed is:

1. A tablet device capable of carrying a protective cover, the protective cover having a protective cover magnetic element and an inductive power transmitter, the tablet device comprising:
   a housing with a front opening; and
   operational components carried by the housing that include:
      a processor in communication with: (i) a sensor capable of detecting a magnetic field, (ii) a display assembly having a display coupled to the processor and overlaid by a protective layer disposed within the front opening, (iii) an inductive power receiver, and (iv) a battery coupled to the inductive power receiver,
      wherein the tablet device is capable of sending a signal to the protective cover that enables the protective cover to use the inductive power transmitter to inductively pass power through the protective layer to the inductive power receiver in accordance with a current battery state of the battery.

2. The tablet device as recited in claim 1, wherein the tablet device sends the signal to the protective cover when the sensor detects the protective cover magnetic element and the tablet device is not connected to an external power supply.

3. The tablet device as recited in claim 1, the protective cover further comprising: a protective cover battery coupled to the inductive power transmitter and capable of storing energy.

4. The tablet device as recited in claim 3, wherein the protective cover battery provides power to the inductive power transmitter for inductive transmission to the inductive power receiver.

5. The tablet device as recited in claim 3, wherein the protective cover battery provides power to the tablet device by way of electrical contacts.

6. The tablet device as recited in claim 2, wherein the protective cover includes a single piece flap having a portion that carries the protective cover magnetic element.

7. The tablet device as recited in claim 6, wherein the sensor is capable of detecting the protective cover magnetic element when the portion of the single piece flap that carries the protective cover magnetic element is in contact with the protective layer.

8. The tablet device as recited in claim 6, further comprising:
   a magnetic element capable of forming a magnetic circuit with the protective cover magnetic element, the magnetic circuit capable of maintaining the portion of the flap carrying the protective cover magnetic element in contact with the protective layer.

9. The tablet device as recited in claim 1, wherein the inductive power transmitter and the inductive power receiver share the same shape.

10. A protective cover capable of being carried by a portable electronic device, the portable electronic device having housing with a front opening and operational components that include a processor in communication with: (i) a sensor capable of detecting a magnetic field, (ii) a display assembly having a display coupled to the processor and overlaid by a protective layer disposed within the front opening, (iii) an inductive power receiver, and (iv) a battery coupled to the inductive power receiver, the protective cover comprising:
    a protective cover magnetic element; and
    an inductive power transmitter, wherein the protective cover is capable of receiving a signal from the portable electronic device that causes the protective cover to use the inductive power transmitter to inductively pass power through the protective layer to the inductive power receiver.

11. The protective cover as recited in claim 10, wherein the portable electronic device sends the signal to the protective cover when (i) the sensor detects the protective cover magnetic element and (ii) the portable electronic device is not connected to an external power supply.

12. The protective cover as recited in claim 10, the protective cover further comprising:
    a protective cover battery coupled to the inductive power transmitter and capable of storing energy.

13. The protective cover as recited in claim 12, wherein the protective cover battery provides power to the inductive power transmitter for inductive transmission to the inductive power receiver.

14. The protective cover as recited in claim 12, wherein the protective cover battery provides power to the portable electronic device by way of electrical contacts.

15. The protective cover as recited in claim 10, wherein the protective cover includes a single piece flap having a portion that carries the protective cover magnetic element.

16. The protective cover as recited in claim 15, wherein the sensor is capable of detecting the protective cover magnetic element when the portion of the single piece flap that carries the protective cover magnetic element is in contact with the protective layer.

17. The protective cover as recited in claim 15, wherein the the portable electronic device further comprising:
    a magnetic element capable of forming a magnetic circuit with the protective cover magnetic element, the magnetic circuit capable of maintaining the portion of the flap carrying the protective cover magnetic element in contact with the protective layer.

18. The protective cover as recited in claim 17, wherein the magnetic circuit is maintained when the single piece flap is configured as a support for supporting the portable electronic device.

19. The protective cover as recited in claim 10, wherein the inductive power transmitter and the inductive power receiver share the same shape.

* * * * *

UNITED STATES PATENT AND TRADEMARK OFFICE
CERTIFICATE OF CORRECTION

| | |
|---|---|
| PATENT NO. | : 10,551,890 B2 |
| APPLICATION NO. | : 15/988447 |
| DATED | : February 4, 2020 |
| INVENTOR(S) | : Wodrich et al. |

It is certified that error appears in the above-identified patent and that said Letters Patent is hereby corrected as shown below:

In the Claims

In Claim 17, at Column 14, Line 48: "the the portable electronic device further comprising:" should read -- the portable electronic device further comprising: --.

Signed and Sealed this
Fourth Day of October, 2022

*Katherine Kelly Vidal*

Katherine Kelly Vidal
*Director of the United States Patent and Trademark Office*